US012355015B2

United States Patent
Iguchi et al.

(10) Patent No.: US 12,355,015 B2
(45) Date of Patent: *Jul. 8, 2025

(54) SEMICONDUCTOR DEVICE (71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tomohiro Iguchi, Himeji Hyogo (JP); Makoto Mizukami, Ibo Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 185 days.

This patent is subject to a terminal disclaimer.

(21) Appl. No.: 17/681,453

(22) Filed: Feb. 25, 2022

(65) Prior Publication Data

US 2023/0092229 A1    Mar. 23, 2023

(30) Foreign Application Priority Data

Sep. 17, 2021    (JP) ................. 2021-152688

(51) Int. Cl.
  *H01L 23/31*    (2006.01)
  *H01L 23/00*    (2006.01)
  *H01L 25/10*    (2006.01)

(52) U.S. Cl.
  CPC ........ *H01L 25/105* (2013.01); *H01L 23/3114* (2013.01); *H01L 23/3121* (2013.01);
  (Continued)

(58) Field of Classification Search
  CPC ..... H01L 25/105; H01L 25/072; H01L 25/18; H01L 23/3114; H01L 23/3121;
  (Continued)

(56) References Cited

U.S. PATENT DOCUMENTS 10,658,344 B2    5/2020  Matsuyama
11,257,760 B2*   2/2022  Saiki ................. H01L 24/49
(Continued)

FOREIGN PATENT DOCUMENTS

CN    109768038 A    5/2019
JP    2004134460 A   4/2004
(Continued)

OTHER PUBLICATIONS

Japanese Office Action dated Jul. 23, 2024 mailed in counterpart Japanese Application No. 2021-152688, 8 pages (with translation).

*Primary Examiner* — Shaun M Campbell
*Assistant Examiner* — Teresa M. Arroyo
(74) *Attorney, Agent, or Firm* — Kim & Stewart LLP (57) ABSTRACT

A semiconductor device includes first, second, and third metal layers on a surface of the insulating substrate. A first terminal is connected to the first metal layer at a first region. A second terminal is connected to the second metal layer at a second region. An output terminal is connected to the third metal layer. First chips are aligned along a first direction on the first metal layer. Second chips are aligned along the first direction on the third metal layer. A first wire connects a first upper electrode of a first chip to the third metal layer. A second wire connects a second upper electrode of a second chip to the second metal layer. The second chips are between the first chips and the third metal layer in a second direction perpendicular to the first direction. Available conductive routes between the first and second terminals are made more uniform.

20 Claims, 6 Drawing Sheets

(52) U.S. Cl.
CPC ............... *H01L 24/32* (2013.01); *H01L 24/48* (2013.01); *H01L 24/73* (2013.01); *H01L 2224/32225* (2013.01); *H01L 2224/48227* (2013.01); *H01L 2224/73265* (2013.01); *H01L 2924/1304* (2013.01)

(58) Field of Classification Search
CPC ............. H01L 23/3735; H01L 23/5386; H01L 23/49811; H01L 23/053; H01L 23/24; H01L 24/32; H01L 24/48; H01L 24/73; H01L 24/29; H01L 24/45; H01L 24/83; H01L 24/92; H01L 24/49; H01L 2224/29101; H01L 2224/92247; H01L 2224/29339; H01L 2224/32225; H01L 2224/48227; H01L 2224/73265; H01L 2224/45014; H01L 2224/48091; H01L 2224/49111; H01L 2224/0603; H01L 2224/49175; H01L 2224/83801; H01L 2924/1304; H01L 2924/12032; H01L 2924/13091; H01L 2924/181; H01L 2924/19107; H02M 1/0048; H02M 7/003; H02M 7/5387
See application file for complete search history.

(56) References Cited

U.S. PATENT DOCUMENTS

| | | |
|---|---|---|
| 11,398,769 B2 | 7/2022 | Otake |
| 11,605,613 B2* | 3/2023 | Iguchi .................... H01L 24/48 |
| 11,705,438 B2* | 7/2023 | Hirakawa ........... H01L 23/3735 |
| | | 257/703 |
| 11,967,545 B2 | 4/2024 | Hayashiguchi |
| 2010/0187690 A1* | 7/2010 | Okada .................... H01L 24/85 |
| | | 257/738 |
| 2013/0082284 A1* | 4/2013 | Okumura ................ H01L 24/73 |
| | | 257/77 |
| 2018/0190636 A1* | 7/2018 | Mukunoki ........ H01L 23/49811 |
| 2020/0185359 A1 | 6/2020 | Nakashima et al. |
| 2020/0286864 A1 | 9/2020 | Horiguchi et al. |
| 2020/0304035 A1 | 9/2020 | Miyake et al. |
| 2020/0395867 A1 | 12/2020 | Horiguchi et al. |
| 2021/0099071 A1 | 4/2021 | Otake |

FOREIGN PATENT DOCUMENTS

| | | |
|---|---|---|
| JP | 2020047677 A | 3/2020 |
| JP | 2020155501 A | 9/2020 |
| WO | 2018143429 A1 | 8/2018 |
| WO | 2019044748 A1 | 3/2019 |
| WO | 2019163205 A1 | 8/2019 |
| WO | 2019163343 A1 | 8/2019 |
| WO | 2021010210 A1 | 1/2021 |

* cited by examiner

SEMICONDUCTOR DEVICE

CROSS-REFERENCE TO RELATED APPLICATION(S)

This application is based upon and claims the benefit of priority from Japanese Patent Application No. 2021-152688, filed Sep. 17, 2021, the entire contents of which are incorporated herein by reference.

FIELD

Embodiments described herein relate generally to a semiconductor device.

BACKGROUND

Silicon carbide is expected to be used as a material for next-generation semiconductor devices. Silicon carbide has excellent physical properties such as a 3 times larger bandgap, an about 10 times stronger breakdown electric field strength, and an about 3 times higher thermal conductivity, as compared to silicon. By utilizing these properties, for example, a metal oxide semiconductor field effect transistor (MOSFET) which is operable at a high temperature with a high pressure resistance and a low loss may be implemented.

A vertical MOSFET formed using silicon carbide has a pn junction diode as a body diode. For example, the MOSFET can be used as a switching element connected to an inductive load. In this case, even when the MOSFET is OFF, a reflux current may be caused to flow via the body diode.

However, when the reflux current is caused to flow in this manner, a problem occurs in that a stacking defect grows in the silicon carbide layer due to the recombination energy of carriers, and thus, the ON-resistance of the MOSFET increases. The increase in ON-resistance of the MOSFET causes a degradation in the reliability of the MOSFET.

There is a MOSFET equipped with a Schottky barrier diode (SBD) that operates in a unipolar manner. When the reflux current is caused to flow via the SBD instead of the pn junction diode that operates in a bipolar manner, the growth of stacking defect is prevented. Thus, the reliability of the MOSFET is improved.

DETAILED DESCRIPTION

Embodiments provide a semiconductor device having improved reliability.

In general, according to one embodiment, a semiconductor device includes an insulating substrate. A first metal layer is on a surface of the insulating substrate. The first metal layer has a first connection region at which the first metal layer is electrically connected to a first main terminal. A second metal layer is on the surface of the insulating substrate. The second metal layer has a second connection region at which the second metal layer is electrically connected to a second main terminal. A third metal layer is on the surface of the insulating substrate between the first metal layer and the second metal layer. The third metal layer has a third connection region at which the third metal layer is electrically connected to the output terminal. A plurality of first semiconductor chips are aligned along a first direction on the first metal layer. Each first semiconductor chip includes a first upper electrode, a first lower electrode, a first gate electrode, a first silicon carbide layer, and a first Schottky barrier diode. A plurality of second semiconductor chips are aligned along the first direction on the third metal layer. Each second semiconductor chip includes a second upper electrode, a second lower electrode, a second gate electrode, a second silicon carbide layer, and a second Schottky barrier diode. A first connection wire electrically connects a first upper electrode of a first semiconductor chip to the third metal layer. A second connection wire electrically connects a second upper electrode of a second semiconductor chip to the second metal layer. The second semiconductor chips are between the first semiconductor chips and the third metal layer in a second direction perpendicular to the first direction. The first connection region and the second connection region are spaced from each other along a third direction intersecting the second direction. The angle between the third direction and the first direction is 20° or less. The angle formed by an extension direction of the second connection wire and the second direction is 20° or less.

In the descriptions herein, the same or substantially similar members, components, elements, or aspects may be denoted by the same reference numerals, and repeated descriptions thereof may be omitted.

In the descriptions herein, in order to indicate the positional relationship of components or the like, the upward direction in each drawing may be referred to as an "upper (above)" direction or the like, and the downward direction in each drawing may be referred to as a "lower (below)" direction or the like. In the descriptions herein, the concepts of "upper" and "lower" do not necessarily indicate the relationship with the direction of gravity.

A semiconductor device of an embodiment includes: an insulating substrate; a first main terminal; a second main terminal; and an output terminal. A first metal layer is formed on the insulating substrate, has a first connection region, and is electrically connected to the first main terminal in the first connection region. A second metal layer is formed on the insulating substrate, has a second connection region, and is electrically connected to the second main terminal in the second connection region. A third metal layer is formed on the insulating substrate between the first metal layer and the second metal layer. The third metal layer has a third connection region and is electrically connected to the output terminal in the third connection region. A plurality of first semiconductor chips each includes a first upper electrode, a first lower electrode, a first gate electrode, a first silicon carbide layer, and a first Schottky barrier diode. The first semiconductor chips are each arranged in a first direction with a first lower electrode electrically connected to the first metal layer. A plurality of second semiconductor chips each includes a second upper electrode, a second lower electrode, a second gate electrode, a second silicon carbide layer, and a second Schottky barrier diode. The second semiconductor chips are each arranged in the first direction with a second lower electrode electrically connected to the third metal layer. A first connection wire electrically connecting a first upper electrode and the third metal layer is provided. A second connection wire is provided to electrically connect a second upper electrode and the second metal layer. The second semiconductor chips in a second direction perpendicular to the first direction from the first semiconductor chips and parallel to the insulating substrate. An angle formed between a third direction (which connects the first connection region and the second connection region) and the first direction is 20° or less. An angle formed between an extension direction of the first connection wire and the second direction is 20° or less. An angle formed between an extension direction of the second connection wire connected to the second upper electrode of a second semiconductor chip closest to the first metal layer among the plurality of second semiconductor chips and the second direction is 20° or less.

Figure 1:
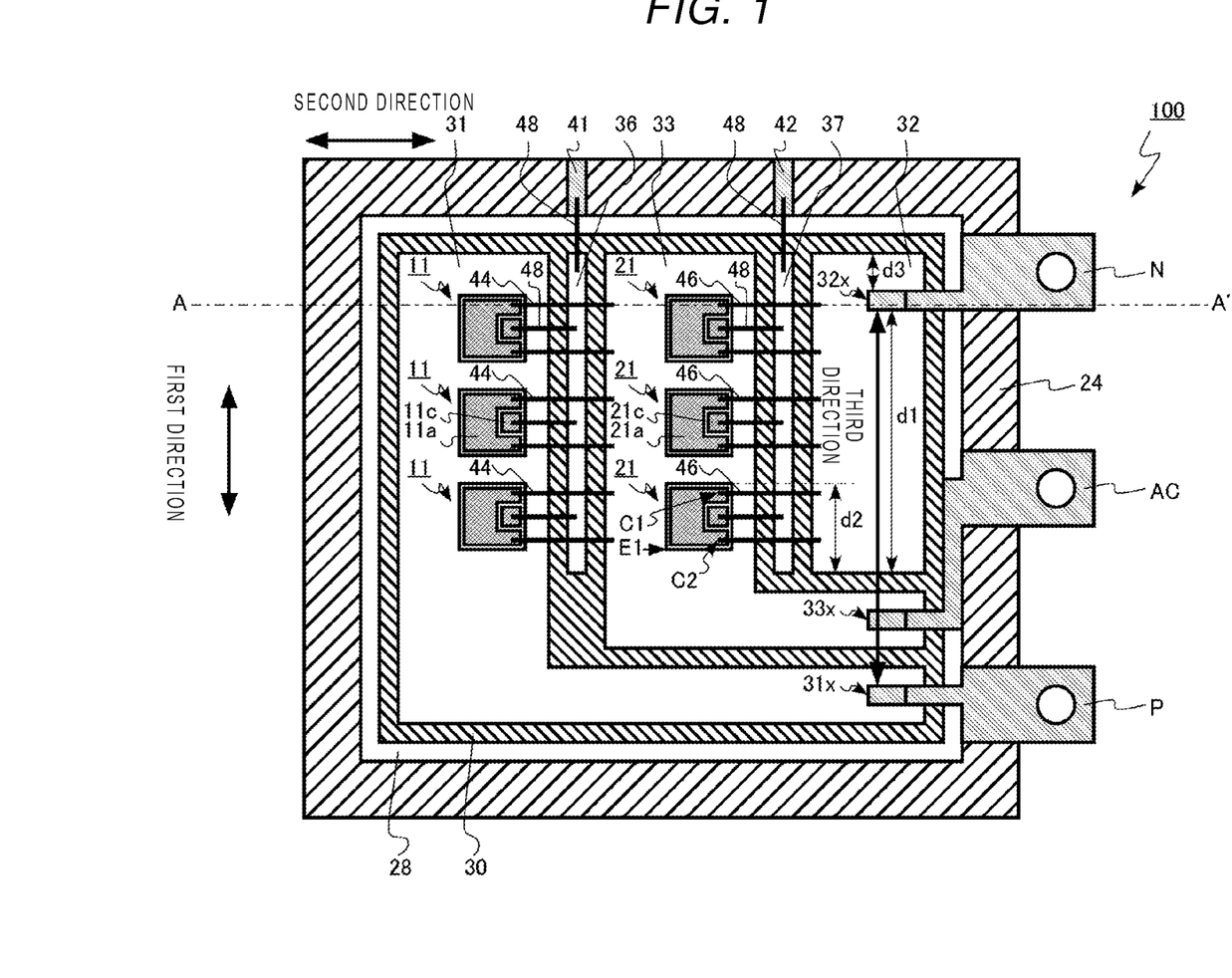
FIG. 1 is a schematic top view illustrating a semiconductor device according to an embodiment.
Figure 2:
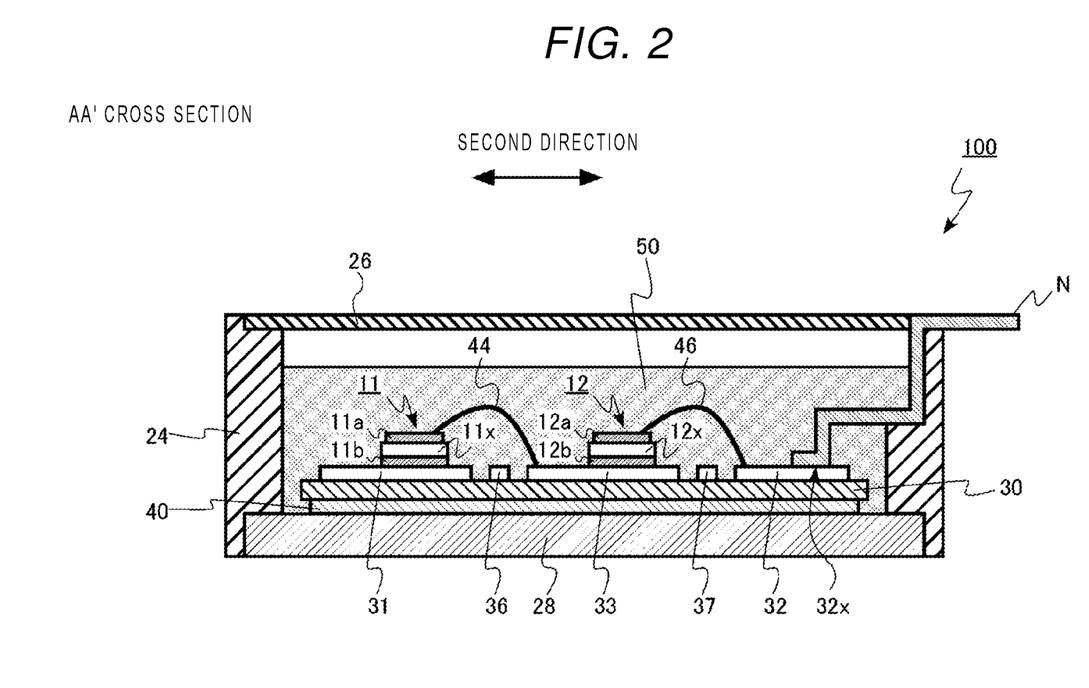
FIG. 2 is a schematic cross-sectional view of a semiconductor device according to an embodiment.
Figure 3:
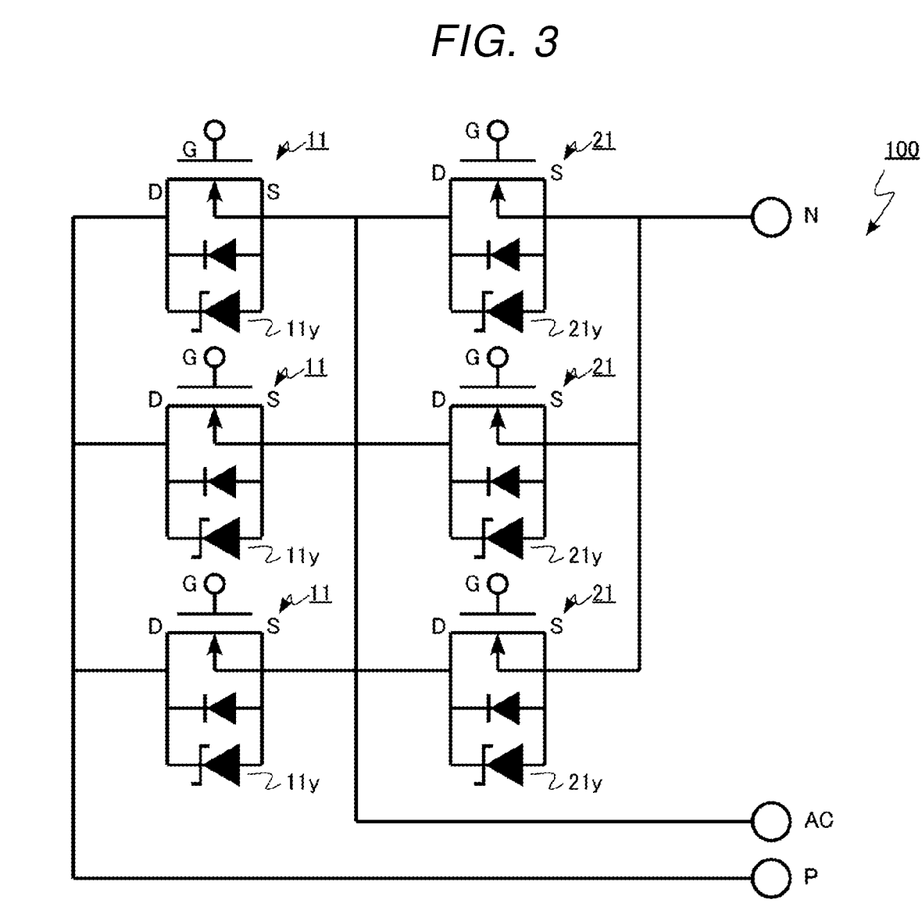
FIG. 3 is an equivalent circuit diagram of a semiconductor device of an embodiment.

FIG. 1 is a schematic top view of a semiconductor device of an embodiment. FIG. 2 is a schematic cross-sectional view of the semiconductor device of the embodiment. FIG. 2 represents the cross section along AA' of FIG. 1. FIG. 3 is an equivalent circuit diagram of the semiconductor device of the embodiment.

The semiconductor device of this example embodiment is a power semiconductor module 100. As illustrated in FIG. 3, the power semiconductor module 100 is a so-called "2 in 1" type module in which a half bridge circuit may be configured with one module. In the power semiconductor module 100, three half bridge units are connected in parallel. For example, a three-phase inverter circuit may be implemented by three power semiconductor modules 100 of the embodiment.

As illustrated in FIG. 3, the power semiconductor module 100 includes a positive terminal P (a first main terminal), a negative terminal N (a second main terminal), an AC output terminal AC (an output terminal), and multiple high-side MOSFETs 11 (first semiconductor chips) and multiple low-side MOSFETs 21 (second semiconductor chips). Each MOSFET has a Schottky barrier diode (SBD) in addition to a pn junction diode. The SBD causes the flow of a reflux current, for example.

The multiple high-side MOSFETs 11 are connected in parallel to each other. The multiple low-side MOSFETs 21 are connected in parallel to each other. The multiple high-side MOSFETs 11 and the multiple low-side MOSFETs 21 are connected in series.

FIGS. 1 to 3 illustrate a non-limiting case where the number of high-side MOSFETs 11 is three, and the number of low-side MOSFETs 21 is three.

As illustrated in FIGS. 1 and 2, the power semiconductor module 100 is provided with the positive terminal P, the negative terminal N, the AC output terminal AC, the high-side MOSFETs 11, the low-side MOSFETs 21, a resin housing 24, a lid 26, a metal base 28, an insulating substrate 30, a first metal layer 31, and a second metal layer 32, a third metal layer 33, a first gate metal layer 36 (a fourth metal layer), a second gate metal layer 37 (a fifth metal layer), a back-surface metal layer 40, a first gate terminal 41, a second gate terminal 42, first bonding wires 44 (first connection wires), second bonding wires 46 (second connection wires), gate bonding wires 48, and a sealing resin 50.

Each of the high-side MOSFETs 11 includes a first source electrode 11a (a first upper electrode), a first drain electrode 11b (a first lower electrode), and a first gate electrode 11c, a first silicon carbide layer 11x, and a first Schottky barrier diode 11y.

Each of the low-side MOSFETs 21 includes a second source electrode 21a (a second upper electrode), a second drain electrode 21b (a second lower electrode), a second gate electrode 21c, a second silicon carbide layer 21x, and a second Schottky barrier diode 21y.

The first metal layer 31 has a first connection region 31x. The second metal layer 32 has a second connection region 32x. The third metal layer 33 has a third connection region 33x.

FIG. 1 is a top view of the power semiconductor module 100 with the lid 26 and the sealing resin 50 removed to depict internal aspects.

The metal base 28 is, for example, copper. For example, when the power semiconductor module 100 is mounted on a product, a heat dissipation plate can be connected to the back surface of the metal base 28.

The insulating substrate 30 is provided on the metal base 28. The insulating substrate 30 is provided between the metal base 28 and the high-side MOSFETs 11, and between the metal base 28 and the low-side MOSFETs 21.

The insulating substrate 30 has a function of electrically separating the metal base 28 from the high-side MOSFETs 11, and the metal base 28 from the low-side MOSFETs 21.

The insulating substrate 30 is, for example, ceramic. The insulating substrate 30 is, for example, aluminum oxide, aluminum nitride, or silicon nitride.

The first metal layer 31, the second metal layer 32, the third metal layer 33, the first gate metal layer 36, and the second gate metal layer 37 are formed on the surface of the insulating substrate 30. The first metal layer 31, the second metal layer 32, the third metal layer 33, the first gate metal layer 36, and the second gate metal layer 37 are, for example, copper.

The back-surface metal layer 40 is formed on the back surface of the insulating substrate 30. The back-surface metal layer 40 is, for example, copper. The back-surface metal layer 40 is joined to the metal base 28 by using, for example, a solder layer or a silver nanoparticle layer.

The resin housing 24 is provided around the metal base 28 and the insulating substrate 30. A portion of the resin housing 24 is provided on the metal base 28. The resin housing 24 has a function of protecting the high-side MOSFETs 11, the low-side MOSFETs 21, and the insulating substrate 30.

The lid 26 is provided on the resin housing 24. The lid 26 has a function of protecting the high-side MOSFETs 11, the low-side MOSFETs 21, and the insulating substrate 30.

The high-side MOSFETs 11 are provided on the first metal layer 31.

The first source electrode 11a is electrically connected to the third metal layer 33. The first source electrode 11a and the third metal layer 33 are electrically connected to each other by a first bonding wire 44 or the like. The first drain electrode 11b is electrically connected to the first metal layer 31. The first drain electrode 11b is electrically connected to the first metal layer 31 by a solder layer or a silver nanoparticle layer.

The high-side MOSFETs 11 are arranged in a first direction parallel to the insulating substrate 30.

The low-side MOSFETs 21 are provided on the third metal layer 33.

The second source electrode 21a is electrically connected to the second metal layer 32. The second source electrode 21a and the second metal layer 32 are electrically connected to each other by a second bonding wire 46 or the like. The second drain electrode 21b is electrically connected to the third metal layer 33. The second drain electrode 21b is electrically connected to the third metal layer 33 by a solder layer or a silver nanoparticle layer.

The low-side MOSFETs 21 are arranged in the first direction parallel to the insulating substrate 30.

The sealing resin 50 fills the resin housing 24. The sealing resin 50 is surrounded by the resin housing 24. The sealing resin 50 covers the high-side MOSFETs 11, the low-side MOSFETs 21, and the insulating substrate 30.

The sealing resin 50 protects the high-side MOSFETs 11, the low-side MOSFETs 21, and the insulating substrate 30. The sealing resin 50 also insulates the high-side MOSFETs 11, the low-side MOSFETs 21, and the insulating substrate 30 from each other.

The sealing resin 50 comprises a resin material such as a silicone gel, an epoxy resin, a polyimide resin, or other resin types.

The positive terminal P is provided on one end side of the insulating substrate 30. For example, in FIG. 1, the positive terminal P is provided on the right side of the insulating substrate 30. The positive terminal P has a wiring connection hole therein.

The positive terminal P is electrically connected to the first metal layer 31 in the first connection region 31x. In the first connection region 31x, the first metal layer 31 and the positive terminal P are connected to each other by using, for example, a solder layer or a silver nanoparticle layer.

A positive voltage can be applied to the positive terminal P from the outside. The positive terminal P is made of a metal. The positive terminal P is, for example, copper.

The negative terminal N is provided on one end side of the insulating substrate 30. The negative terminal N is provided on the same side of the insulating substrate 30 as the positive terminal P in this example. The negative terminal N has a wiring connection hole therein.

The negative terminal N is electrically connected to the second metal layer 32 in the second connection region 32x. In the second connection region 32x, the second metal layer 32 and the negative terminal N are connected to each other by using, for example, a solder layer or a silver nanoparticle layer.

A negative voltage can be applied to the negative terminal N from the outside. The negative terminal N is made of a metal. The negative terminal N is, for example, copper.

The AC output terminal AC is provided on one end side of the insulating substrate 30. The AC output terminal AC is provided on the same side of the insulating substrate 30 as the positive terminal P and the negative terminal N in this example. The AC output terminal AC has a wiring connection hole therein.

The AC output terminal AC is electrically connected to the third metal layer 33 in the third connection region 33x. In the third connection region 33x, the third metal layer 33 and the AC output terminal AC are connected to each other by using, for example, a solder layer or a silver nanoparticle layer.

The AC output terminal AC outputs output currents of the half bridge circuits. The AC output terminal AC is made of a metal. The AC output terminal AC is, for example, copper.

The first gate terminal 41 is electrically connected to the first gate electrodes 11c of the high-side MOSFETs 11. The first gate terminal 41 is electrically connected to the first gate electrodes 11c by using, for example, the first gate metal layer 36 and a gate bonding wire 48.

The second gate terminal 42 is electrically connected to the second gate electrodes 21c of the low-side MOSFETs 21. The second gate terminal 42 is electrically connected to the second gate electrodes 21c by using, for example, the second gate metal layer 37 and a gate bonding wire 48.

The first metal layer 31 is formed on the insulating substrate 30. The first metal layer 31 includes the first connection region 31x. The first metal layer 31 is electrically connected to the positive terminal P in the first connection region 31x.

The second metal layer 32 is formed on the insulating substrate 30. The second metal layer 32 includes the second connection region 32x. The second metal layer 32 is electrically connected to the negative terminal N in the second connection region 32x. The second metal layer 32 is electrically connected to the second source electrodes 21a of the low-side MOSFETs 21.

The third metal layer 33 is formed on the insulating substrate 30. The third metal layer 33 includes the third connection region 33x. The third metal layer 33 is electrically connected to the AC output terminal AC in the third connection region 33x. The third metal layer 33 is electrically connected to the first source electrodes 11a of the high-side MOSFETs 11.

A low-side MOSFETs 21 is arranged adjacent, in a second direction that is perpendicular to the first direction and parallel to the insulating substrate 30, to each of the high-side MOSFETs 11. In other words, for each high-side MOSFET 11 there is provided an adjacent low-side MOSFET 21 in the second direction.

The direction from the first connection region 31x to the second connection region 32x is defined as a third direction in this example. The third direction is the direction of a straight-line segment that connects the first connection region 31x and the second connection region 32x with the shortest distance. The angle formed by the third direction and the first direction is 20° or less (that is, the angle of intersection of the third direction with the first direction is 20° or less).

For example, in FIG. 1, the third direction is parallel to the first direction. The intersection angle between the third direction and the first direction is 0°. Thus, the high-side MOSFETs 11 are arranged in the third direction since the third direction is parallel to the first direction in this example. Likewise, the low-side MOSFETs 21 are arranged in the third direction.

The angle formed by between the direction (the extension direction) at which the first bonding wire 44 extends and the second direction is 20° or less. For example, when multiple first bonding wires 44 are connected to each high-side MOSFET 11, the angle formed by the extension direction of at least one of these first bonding wires 44 and the second direction is 20° or less. The angle formed by the extension direction of a first bonding wire 44 connected to each of the high-side MOSFETs 11 and the second direction is 20° or less.

The angle formed by the extension direction of the first bonding wire 44 and the third direction is in a range of 70° to 90° For example, when multiple first bonding wires 44 are connected to each high-side MOSFET 11, the angle formed by the extension direction of at least one of the multiple first bonding wires 44 and the third direction is in the range of 70° to 90° s. The angle formed by the extension direction of a first bonding wire 44 connected to each of the multiple high-side MOSFETs 11 and the third direction is in the range of 70° to 90°.

In this context, the extension direction of the first bonding wire 44 is taken as the direction of the straight-line segment that connects the position where the first bonding wire 44 contacts the first source electrode 11*a* and the position where the first bonding wire 44 contacts the third metal layer 33.

For example, the angle formed by the extension directions of the first bonding wires 44 and the second direction is 20° or less. FIG. 1 represents a case where the angle formed by the extension directions of each of the first bonding wires 44 and the second direction is 0° (that is, the extension direction of each first bonding wire 44 is parallel to the second direction in FIG. 1).

The angle formed by the extension direction of the second bonding wire 46 and the second direction is 20° or less. For example, when multiple second bonding wires 46 are connected to one low-side MOSFET 21, the angle formed by at least one of the multiple second bonding wires 46 and the second direction is 20° or less. The angle formed by a second bonding wire 46 (more particularly, the extension direction of the second bonding wire 46) connected to any one of the low-side MOSFETs 21 and the second direction can be 20° or less.

The angle formed by the extension direction of the second bonding wire 46 connected to the second source electrode 21*a* of the low-side MOSFET 21 closest to the first metal layer 31 in the first direction, among the multiple low-side MOSFETs 21, and the second direction is 20° or less. That is, in FIG. 1, the angle formed by the second bonding wire 46 connected to the second source electrode 21*a* of the low-side MOSFET 21 at the lowest side, among the multiple low-side MOSFETs 21, and the second direction is 20° or less.

The angle between the extension direction of the second bonding wire 46 and the third direction is in a range of 70° to 90°. For example, when multiple second bonding wires 46 are connected to one low-side MOSFET 21, the angle formed by the extension direction of at least one of the second bonding wires 46 and the third extension direction is in a range of 70° to 90°. The angle formed by the extension direction of the second bonding wire 46 connected to any one of the multiple low-side MOSFETs 21 and the third direction can be 70° to 90°.

The extension direction of the second bonding wire 46 is, for example, the direction of the straight-line segment that connects the position where the second bonding wire 46 is in contact with the second source electrode 21*a* and the position where the second bonding wire 46 is in contact with the second metal layer 32.

For example, the angle formed by the extension directions of all of the second bonding wires 46 provided in the semiconductor module 100 and the second direction is 20° or less. FIG. 1 represents a case where the extension directions of all of the second bonding wires 46 and the second direction is 0°.

For example, the second metal layer 32 is adjacent in the second direction of the low-side MOSFET 21 closest to the first metal layer 31 in the first direction, among the multiple low-side MOSFETs 21. That is, in FIG. 1, the second metal layer 32 is adjacent (in the second direction) to the low-side MOSFET 21 at the lowest side, among the multiple low-side MOSFETs 21.

For example, the second metal layer 32 is in the second direction from the contact points between the second source electrode 21*a* of the low-side MOSFET 21 closest to the first metal layer 31 in the first direction (C1 and C2 in FIG. 1), among the multiple low-side MOSFETs 21, and the second bonding wires 46. For example, of the contact points between the second source electrode 21*a* of the low-side MOSFET 21 closest to the first metal layer 31 in the first direction among the multiple low-side MOSFETs 21, and the second bonding wires 46, the second metal layer 32 exists in the second direction of the contact point closest to the first metal layer 31 (C2 in FIG. 1).

The second metal layer 32 is in the second direction from the end of the low-side MOSFET 21 closest to the first metal layer 31 in the first direction, the end which is close to the first metal layer 31 (E1 in FIG. 1).

A first distance in the first direction between the second connection region 32*x* and the end of the second metal layer 32 close to the first metal layer 31 (distance d1 in FIG. 1) is greater than a second distance in the first direction between the end of the low-side MOSFET 21 closest to the first metal layer 31 in the first direction among the multiple low-side MOSFETs 21, the end which is away from the first metal layer 31, and the end of the second metal layer 32 close to the first metal layer 31 (distance d2 in FIG. 1).

For example, the first distance in the first direction between the second connection region 32*x* and the end of the second metal layer 32 close to the first metal layer 31 (distance d1 in FIG. 1) is larger than a third distance in the first direction between the second connection region 32*x* and the end of the second metal layer 32 which is facing in the first direction away from the first metal layer 31 (distance d3 in FIG. 1).

Next, the operation and effects of the semiconductor device of the embodiment will be described.

A vertical MOSFET using silicon carbide has a pn junction diode as a body diode. For example, the MOSFET is used as a switching element connected to an inductive load. In this case, even when the MOSFET is OFF, a reflux current may be caused to flow via the body diode.

However, when the reflux current is caused to flow in this manner, a problem occurs in that a stacking defect tends to grow in the silicon carbide layer due to recombination energy of carriers, and thus, the ON-resistance of the MOSFET increases. The increase in ON-resistance of the MOSFET causes a degradation in reliability of the MOSFET.

There is a MOSFET equipped with a Schottky barrier diode (SBD) that operates in a unipolar form. When the reflux current is caused to flow via the SBD instead of the pn junction diode that operates in a bipolar form, the growth of a stacking defect is prevented. Thus, the reliability of the MOSFET is improved.

In a power semiconductor module including multiple MOSFETs each equipped with an SBD, it also becomes important to prevent the operation of the pn junction diode of each MOSFET, from the viewpoint of improving the reliability of the power semiconductor module.

Figure 4:
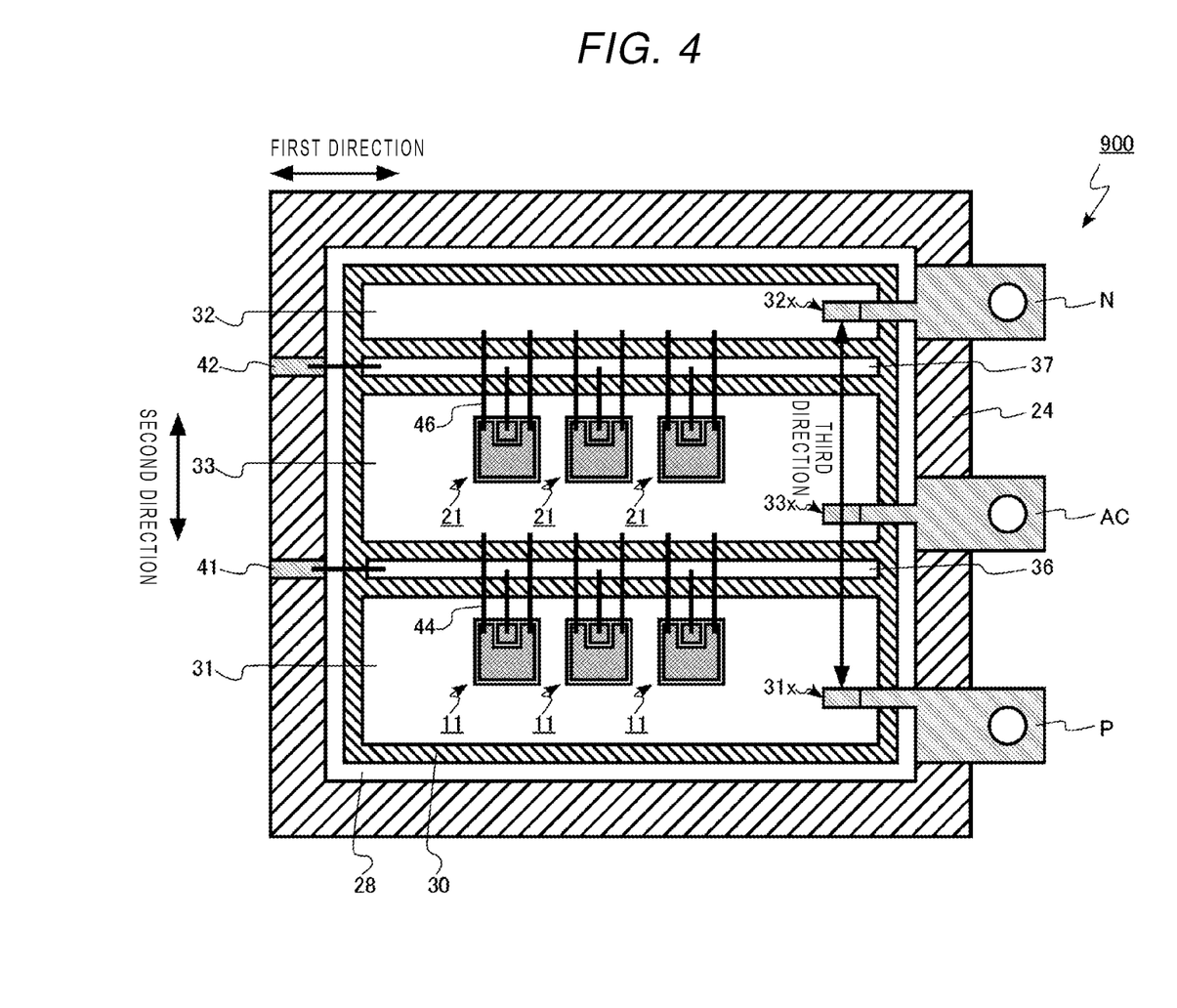
FIG. 4 is a schematic top view of a semiconductor device of a comparative example.

FIG. 4 is a schematic top view of a semiconductor device of a comparative example. The semiconductor device of the comparative example is a power semiconductor module 900. The equivalent circuit diagram of the power semiconductor module 900 is the same as illustrated in FIG. 3.

As illustrated in FIG. 4, the power semiconductor module 900 is different from the power semiconductor module 100 of the above embodiment in that the high-side MOSFETs 11 are arranged along a different direction. That is, the "first direction" of FIG. 4 is perpendicular to the "third direction" of FIG. 4. Likewise, the power semiconductor module 900 is different from the power semiconductor module 100 in that the low-side MOSFETs 21 are also arranged perpendicular to the third direction rather than parallel. In this context, the third direction is the direction that connects the first connection region 31*x* and the second connection region 32*x*.

As illustrated in FIG. 4, the power semiconductor module 900 is different from the power semiconductor module 100 in that the angle formed by the extension direction of the first bonding wires 44 and the third direction is zero (that is, the first bonding wires 44 are parallel to the third direction in FIG. 4). Likewise, as illustrated in FIG. 4, the angle formed by the extension direction of the second bonding wires 46 and the third direction is zero.

It has been noticed that during the switching operation of the power semiconductor module 900, a variation occurs in the currents flowing through the diodes provided in the high-side MOSFETs 11 or the diodes provided in the low-side MOSFETs 21. It has also been identified that when the variation of the currents flowing through the diodes becomes large, the pn junction diode may operate by exceeding the amount of current that may be caused to flow by the Schottky barrier diode.

Figure 5:
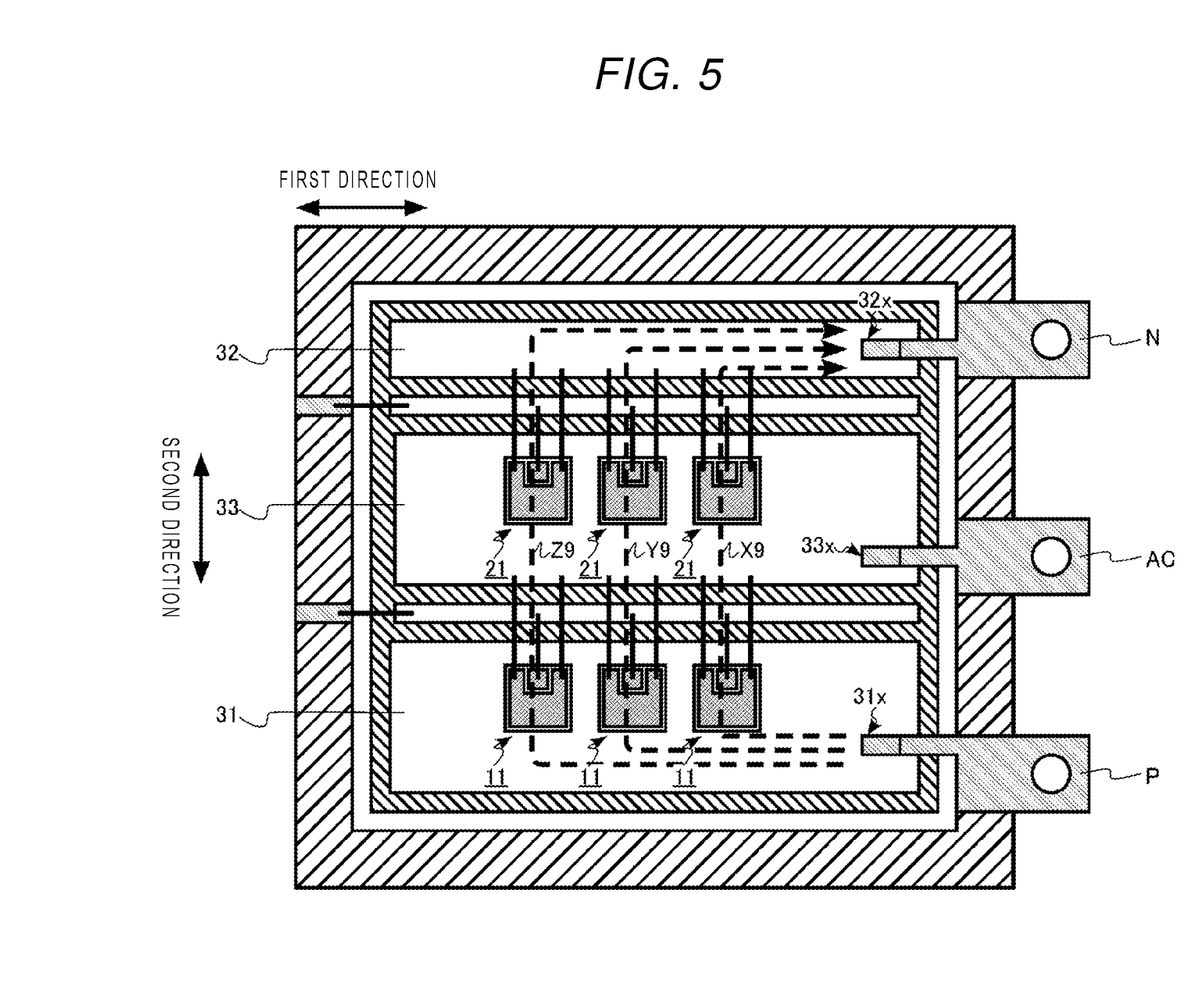
FIG. 5 is a view illustrating a problem of a semiconductor device of a comparative example.

FIG. 5 is a view illustrating aspects of a problem in a semiconductor device of the comparative example. FIG. 5 is a schematic top view of the power semiconductor module 900.

FIG. 5 depicts three routes from the positive terminal P to the negative terminal N through the MOSFETs, that is, labelled routes X9, Y9, and Z9 depicted by dashed arrows. The routes X9, Y9, and Z9 are routes from the first connection region 31x to the second connection region 32x.

As a result of the investigation by the present inventors, it has been identified that the variation of the currents flowing through the diodes during the switching operation of the power semiconductor module 900 depends on the variation of the lengths of the routes X9, Y9, and Z9.

For example, among the three routes, the route X9 is the shortest route, and the route Z9 is the longest route. The current flowing through the diodes of the MOSFETs on the route X9, which is the shortest route, is the largest. The current flowing through the diodes of the MOSFETs on the route Z9, which is the longest route, is the smallest.

For example, it may be considered that the power semiconductor module 900 is connected to an external inductive load, the multiple high-side MOSFETs 11 are in an OFF state, and the multiple low-side MOSFETs 21 are in an ON state in which the current flows. From this state, the multiple high-side MOSFETs 11 are switched to the ON state, and the multiple low-side MOSFETs 21 are switched to the OFF state. At this time, the multiple low-side MOSFETs 21 enter a reverse conduction state, and a reflux current flows through the diodes in the low-side MOSFETs 21.

At this time, the current flowing through the diodes of the low-side MOSFETs 21 on the route X9 (shortest route) becomes the largest. The current flowing through the diodes of the low-side MOSFETs 21 on the route Z9 (longest route) becomes the smallest.

When the reflux current flowing through the diodes of the low-side MOSFETs 21 on the route X9 exceeds an allowable current range of a second Schottky barrier diode 21y provided in the low-side MOSFET 21, the pn junction diode begins to operate. When the pn junction diode operates, the reliability of the low-side MOSFETs 21 on the route X9 is degraded. Thus, the reliability of the power semiconductor module 900 as a whole is degraded.

Figure 6:
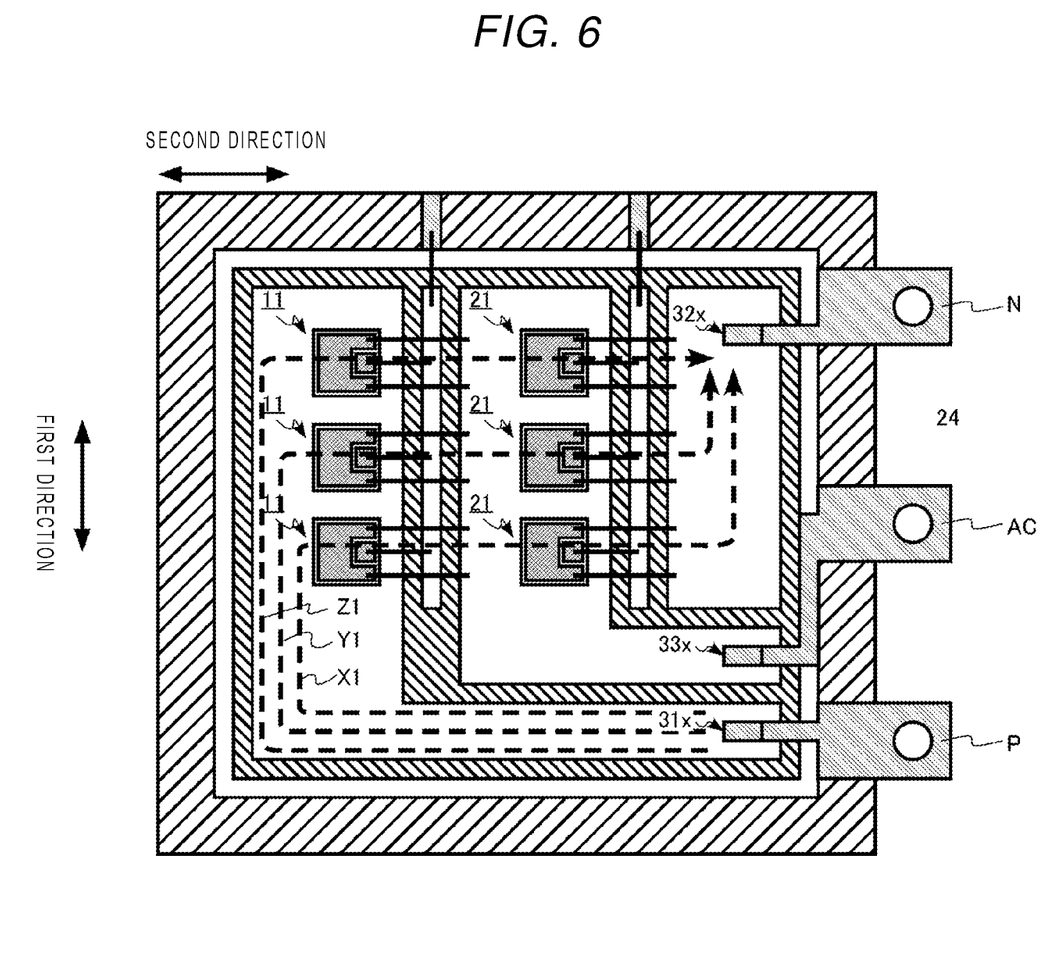
FIG. 6 depicting aspects related to operation and effects of a semiconductor device according to an embodiment.

FIG. 6 is a view illustrating the operation and effects of a semiconductor device of an embodiment. FIG. 6 is a schematic top view of the power semiconductor module 100.

FIG. 6 depicts three routes from the positive terminal P to the negative terminal N through the MOSFETs, that is, routes X1, Y1, and Z1 depicted as dashed arrows. The routes X1, Y1, and Z1 are routes from the first connection region 31x to the second connection region 32x.

The power semiconductor module 100 of the first embodiment reduces the difference in the lengths of the routes X1, Y1, and Z1 by changing the arrangement direction of the MOSFETs and the extension direction of the bonding wires, as compared with the power semiconductor module 900 of the comparative example.

Specifically, the multiple high-side MOSFETs 11 are arranged along the third direction that connects the first connection region 31x and the second connection region 32x. The multiple low-side MOSFETs 21 are also arranged along the third direction. The angle formed by the third direction and the first direction in which the multiple high-side MOSFETs 11 and the multiple low-side MOSFETs 21 are arranged is 20° or less.

The angle formed by the extension direction of the first bonding wire 44 and the second direction is 20° or less. The angle formed by the extension direction of the second bonding wire 46 and the second direction is 20° or less.

With the configuration described above, the power semiconductor module 100 can have substantially equal (or at least relatively less variation as compared to the comparative example) lengths for the routes X1, Y1, and Z1. Thus, the variation of the currents flowing through the diodes during the switching operation of the power semiconductor module 100 is reduced. Accordingly, the operation of the pn junction diode provided in each MOSFET can be prevented. As a result, the reliability of the power semiconductor module 100 is improved.

The angle formed by the third direction and the direction along which the high-side MOSFETs 11 and the low-side MOSFETs 21 are arranged is preferably 10° or less, more preferably 5° or less, and most preferably 0°. As the angle becomes smaller, the variation of the lengths of the routes X1, Y1, and Z1 is further reduced.

The angle formed by the extension directions of all of the first bonding wires 44 provided in the semiconductor module 100 and the second direction is preferably 20° or less. Likewise, the angle formed by the extension directions of all of the second bonding wires 46 provided in the semiconductor module 100 and the second direction is preferably 20° or less. With this configuration, the variation of the lengths of the routes X1, Y1, and Z1 is further reduced.

The angle formed by the extension direction of the first bonding wires 44 and the second direction is preferably 10° or less, more preferably 5° or less, and most preferably 0°. The angle formed by the extension direction of the second bonding wires 46 and the second direction is preferably 10° or less, more preferably 5° or less, and most preferably 0°. As the angle becomes smaller, the variation of the lengths of the routes X1, Y1, and Z1 is further reduced.

It is preferable that the second metal layer 32 is in the second direction from the low-side MOSFET 21 closest to the first metal layer 31 in the first direction, among the low-side MOSFETs 21. That is, in FIG. 1, it is preferable that the second metal layer 32 includes a portion that is in the second direction from the low-side MOSFET 21 at the lowest side among the multiple low-side MOSFETs 21. With this configuration, the variation of the lengths of the routes X1, Y1, and Z1 is further reduced.

It is preferable that the second metal layer 32 is in the second direction from the contact points between the second source electrode 21a of the low-side MOSFET 21 closest to the first metal layer 31 in the first direction (C1 and C2 in FIG. 1), among the multiple low-side MOSFETs 21, and the second bonding wires 46. It is preferable that, of the contact points between the second source electrode 21a of the low-side MOSFET 21 closest to the first metal layer 31 in the first direction among the multiple low-side MOSFETs 21, and the second bonding wires 46, the second metal layer 32 exists in the second direction of the contact point closest to the first metal layer 31 (C2 in FIG. 1). With this configuration, the variation of the lengths of the routes X1, Y1, and Z1 is further reduced.

It is preferable that the second metal layer 32 is in the second direction from the end of the low-side MOSFET 21 closest to the first metal layer 31 in the first direction among the multiple low-side MOSFETs 21, the end which is close to the first metal layer 31 (E1 in FIG. 1). With this configuration, the variation of the lengths of the routes X1, Y1, and Z1 is further reduced.

It is preferable that the first distance in the first direction between the second connection region 32x and the end of the second metal layer 32 close to the first metal layer 31 (distance d1 in FIG. 1) is larger than the second distance in the first direction between the end of the low-side MOSFET 21 closest to the first metal layer 31 in the first direction among the multiple low-side MOSFETs 21, the end which is away from the first metal layer 31, and the end of the second metal layer 32 close to the first metal layer 31 (distance d2 in FIG. 1). With this configuration, the variation of the lengths of the routes X1, Y1, and Z1 is further reduced.

It is preferable that the first distance in the first direction between the second connection region 32x and the end of the second metal layer 32 close to the first metal layer 31 (distance d1 in FIG. 1) is larger than the third distance in the first direction between the second connection region 32x and the end of the second metal layer 32 which is opposite to the first metal layer 31 (distance d3 in FIG. 1). With this configuration, the variation of the lengths of the routes X1, Y1, and Z1 is further reduced.

In the present disclosure, example descriptions are made of a case where the number of power semiconductor chips arranged in parallel is three as one example. The number of power semiconductor chips may be two or four or more.

In the present disclosure, example descriptions are made of a case where the power semiconductor module is a "2 in 1" type module. However, in other examples, the power semiconductor module may have other circuit configurations such as a "4 in 1" type module or a "6 in 1" type module.

The bonding wires may be linear bonding wires or ribbon-shaped bonding wires. Furthermore, in some examples, the bonding wires may be plate-shaped conductors for performing an electric connection.

In the present disclosure, example descriptions are made of a case where a portion of the terminal such as the positive terminal P or the like is directly connected to the metal layer as one example. In other examples, terminal and the metal layer may be connected by, for example, a bonding wire.

In the present disclosure, example descriptions are made of a case where the positive terminal, the negative terminal, and the AC output terminal are all provided at the same end of the power semiconductor module as on example. The arrangement positions of the positive terminal, the negative terminal, and the AC output terminal are not limited to the arrangement positions described above.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
an insulating substrate;
a first metal layer on a surface of the insulating substrate, the first metal layer having a first connection region at which the first metal layer is electrically connected to a first main terminal;
a second metal layer on the surface of the insulating substrate, the second metal layer having a second connection region at which the second metal layer is electrically connected to a second main terminal;
a third metal layer on the surface of the insulating substrate between the first metal layer and the second metal layer, the third metal layer having a third connection region at which the third metal layer is electrically connected to an output terminal;
a plurality of first semiconductor chips aligned along a first direction on the first metal layer, each first semiconductor chip including a first upper electrode, a first lower electrode, a first gate electrode, a first silicon carbide layer, and a first Schottky barrier diode;
a plurality of second semiconductor chips aligned along the first direction on the third metal layer, each second semiconductor chip including a second upper electrode, a second lower electrode, a second gate electrode, a second silicon carbide layer, and a second Schottky barrier diode;
a first connection wire electrically connecting a first upper electrode of a first semiconductor chip to the third metal layer; and
a second connection wire electrically connecting a second upper electrode of a second semiconductor chip to the second metal layer, wherein
the second semiconductor chips are between the first semiconductor chips and the third metal layer in a second direction perpendicular to the first direction,
the first connection region and the second connection region are spaced from each other along a third direction intersecting the second direction,
the third connection region is between the first and second connection regions in the third direction,
the angle between the third direction and the first direction is between 20° and 0°, range end points inclusive, and
the angle between an extension direction of the second connection wire and the second direction is between 20° and 0°, range end points inclusive.

2. The semiconductor device according to claim 1, wherein the second connection wire is connected to the second semiconductor chip that is nearest to the first metal layer in the first direction.

3. The semiconductor device according to claim 2, wherein the second metal layer is in the second direction from the second semiconductor chip that is nearest to the first metal layer in the first direction.

4. The semiconductor device according to claim 1, wherein the second metal layer is in the second direction from the second semiconductor chip that is nearest to the first metal layer in the first direction.

5. The semiconductor device according to claim 1, wherein the second metal layer is in the second direction from a contact point between the second connection wire and the second upper electrode of the second semiconductor chip that is nearest to the first metal layer in the first direction.

6. The semiconductor device according to claim 1, wherein the second metal layer is in the second direction from an outer edge of the second semiconductor chip that is nearest to the first metal layer in the first direction, the outer edge faces toward the first metal layer in the first direction.

7. The semiconductor device according to claim 1, wherein
a first distance along the first direction between the second connection region and an edge of the second metal layer facing toward the first metal layer in the first direction is greater than a second distance in along the first direction between the edge of the second metal layer and a position of an inner edge of the second semiconductor chip that is nearest to the first metal layer in the first direction, the inner edge facing in the first direction away from the first metal layer.

8. The semiconductor device according to claim 7, wherein the first distance is greater than a third distance along the first direction between the second connection region and an outer edge of the second metal layer facing away from the first metal layer in the first direction.

9. The semiconductor device according claim 1, further comprising:
a fourth metal layer on the surface of the insulating substrate between the first metal layer and the third metal layer in the second direction, the fourth metal layer being electrically connected to a first gate electrode of a first semiconductor chip.

10. The semiconductor device according to claim 9, further comprising:
a fifth metal layer on the surface of the insulating substrate between the second metal layer and the third metal layer in the second direction, the fifth metal layer being electrically connected to a second gate electrode of a second semiconductor chip.

11. The semiconductor device according to claim 10, wherein the angle between an extension direction of the first connection wire and the second direction is between 20° and 0°, range endpoints inclusive.

12. The semiconductor device according to claim 1, wherein the angle between an extension direction of the first connection wire and the second direction is between 20° and 0°, range endpoints inclusive.

13. The semiconductor device according to claim 1, further comprising:
a resin housing surrounding the insulating substrate;
a resin inside the resin housing covering the surface of the insulating substrate, the plurality of first semiconductor chips, the plurality of second semiconductor chips, the first connection wire, and the second connection wire; and
a lid covering the inside of the resin housing.

14. The semiconductor device according to claim 1, wherein the first connection wire is a bonding wire.

15. The semiconductor device according to claim 1, wherein
the first semiconductor chips are MOSFETs, and
the second semiconductor chips are MOSFETs.

16. A power semiconductor module, comprising:
an insulating substrate;
a first metal layer on a surface of the insulating substrate, the first metal layer having a first connection region at which the first metal layer is electrically connected to a first main terminal;
a second metal layer on the surface of the insulating substrate, the second metal layer having a second connection region at which the second metal layer is electrically connected to a second main terminal;
a third metal layer on the surface of the insulating substrate between the first metal layer and the second metal layer, the third metal layer having a third connection region at which the third metal layer is electrically connected to an output terminal;
a plurality of high-side transistor chips aligned along a first direction on the first metal layer, each high-side transistor chip including a first upper electrode, a first lower electrode, a first gate electrode, a first silicon carbide layer, and a first Schottky barrier diode;
a plurality of low-side transistor chips aligned along the first direction on the third metal layer, each low-side transistor chip including a second upper electrode, a second lower electrode, a second gate electrode, a second silicon carbide layer, and a second Schottky barrier diode;
a plurality of first bonding wires electrically connecting the first upper electrodes to the third metal layer; and
a plurality of second bonding wires electrically connecting the second upper electrodes to the second metal layer, wherein
the low-side transistor chips are between the high-side transistor chips and the third metal layer in a second direction perpendicular to the first direction,
the first connection region and the second connection region are spaced from each other along a third direction intersecting the second direction,
the third connection region is between the first and second connection regions in the third direction,
the angle between the third direction and the first direction is between 20° and 0°, range endpoints inclusive, and
the angle between an extension direction of the second bonding wires and the second direction is between 20° and 0°, range endpoints inclusive.

17. The power semiconductor module according to claim 16, wherein the angle between an extension direction of the first bonding wires and the second direction is between 20° and 0°, range endpoints inclusive.

18. The power semiconductor module according to claim 16, further comprising:
a resin housing surrounding the insulating substrate;
a resin inside the resin housing covering the surface of the insulating substrate, the plurality of high-side transistor chips, the plurality of low-side transistor chips, the plurality of first bonding wires, and the plurality of the second bonding wires; and
a lid covering the inside of the resin housing.

19. The power semiconductor module according to claim 18, wherein
the first main terminal, the second main terminal, and the output terminal each include portions extending beyond the resin housing.

20. The power semiconductor module according to claim 16, wherein
the first metal layer has an L-shape,
the third metal layer has an L-shape, and
the second metal layer has a rectangular shape.

* * * * *